United States Patent [19]
Davis et al.

[11] Patent Number: 6,126,489
[45] Date of Patent: Oct. 3, 2000

[54] ELECTRICAL CONNECTOR FOR PRINTED CIRCUIT BOARDS

[75] Inventors: Wayne Samuel Davis, Harrisburg; Robert Neil Whiteman, Jr., Middletown, both of Pa.

[73] Assignee: The Whitaker Corporation, Wilmington, Del.

[21] Appl. No.: 09/183,007

[22] Filed: Oct. 30, 1998

[51] Int. Cl.[7] .................................................. H01R 13/10
[52] U.S. Cl. ............................................................ 439/682
[58] Field of Search .............................. 439/682, 83, 78, 439/79, 80

[56] References Cited

U.S. PATENT DOCUMENTS

| | | | |
|---|---|---|---|
| 3,951,494 | 4/1976 | Romine | 339/17 L |
| 4,232,923 | 11/1980 | Otsuki et al. | 339/17 LC |
| 5,197,891 | 3/1993 | Tanigawa et al. | 439/83 |
| 5,611,699 | 3/1997 | Taniqawa | 439/78 |
| 5,685,726 | 11/1997 | Lwee et al. | 439/83 |

*Primary Examiner*—Brian Sircus
*Assistant Examiner*—Eugene G. Byrd
*Attorney, Agent, or Firm*—Michael Aronoff

[57] ABSTRACT

An electrical connector (10) mountable to a surface (41) of a printed circuit board (40, 48) for electrically connecting a component (50) to the board (40, 48). The connector (10) has a plurality of contacts (12) supported in a plurality of contact receiving apertures (18) of a connector housing (14). Each of the plurality of contacts (12) is in the form of a thin flat plate (12) having a conductive element engaging portion (32) and a tail portion (33) which is electrically connectable to the board (40, 48), and each contact receiving aperture (18) is a narrow slot (18) which receive a contact (12) and maintains the contact (12) properly positioned in the housing (14). The housing (14) also has a plurality of conductive element receiving apertures (29) for receiving leads (51) of the component (50), each of which intersect with a contact receiving aperture (18) for engaging a lead (51) of the component (50) with the contact engaging portion (32) of a contact (12) to connect the component (50) to the connector (10).

19 Claims, 7 Drawing Sheets

ELECTRICAL CONNECTOR FOR PRINTED CIRCUIT BOARDS

BACKGROUND OF THE INVENTION

1. Field of the Invention

The present invention relates generally to electrical connectors and, more particularly, to electrical connectors for use with printed circuit boards.

2. Description of the Prior Art

Electrical connectors are often used with printed circuit boards to electrically connect various components to the boards. Such connectors are typically mountable on the top surface of a board and usually include a dielectric housing having one or more contacts supported therein. The contacts include a conductive element engaging portion for engaging a lead of a component, and a tail portion which is connectable to a circuit on the bottom surface (circuit side) of the board, for example, by extending the tail portion through a hole in the board, and then soldering the end of the tail portion to the circuit.

A component to be electrically connected to the printed circuit board is positioned on the circuit side of the board below the connector, and is connected to the connector by extending leads of the component through holes in the board and through openings in the bottom of the connector housing into the connector to be engaged by the conductive element engaging portions of the contact in the connector. Such a connector, in which the leads of the component to be connected are received through the bottom of the connector housing, is commonly referred to as a "bottom entry connector"; and is desirable in many applications.

In order for the connector to function properly, the conductive element engaging portion of each contact must provide a reliable mechanical and electrical connection between a lead of the component and the contact. In addition, the tail portion of each contact must be sufficiently stable to ensure accurate positioning preparatory to soldering to ensure proper connection to the board. Various connector designs have been developed in an effort to satisfy such requirements.

Certain components to be connected, however, have a large number of leads which are very closely spaced. For example, vacuum fluorescent displays are known which range in size from 28 position to 76 position with their leads being on 1.5 mm, 2.0 mm and 0.100 inch centerlines. Current bottom entry printed circuit board connectors are not fully suitable for connecting such components because their designs do not allow their contacts to be placed on such close centerlines.

SUMMARY OF THE INVENTION

The present invention generally provides an electrical connector which is mountable to a surface of a printed circuit board for electrically connecting a component to the board. More particularly, the invention relates to a bottom entry type electrical connector mountable on the top surface of a printed circuit board for electrically connecting a component having closely spaced leads and positioned on the opposite side (circuit side) of the board to a circuit on the board.

The connector according to the present invention includes at least one contact, each of which comprises a substantially flat plate having a conductive element engaging portion engagable with a conductive element of the component, and a tail portion connectable to the printed circuit board. The connector also includes a housing for supporting each of the at least one contacts, the housing including at least one contact receiving aperture which receives the at least one contact, each of the at least one contact receiving apertures comprising an elongated slot having a first section which receives the conductive element engaging portion of a contact, and a second section which receives the tail portion of the contact, the second section having an elongated opening in a bottom wall of the housing through which the tail portion extends to be connected to the printed circuit board. The housing also includes at least one conductive element receiving aperture, each of which intersects with the first section of a contact receiving aperture such that a conductive element of a component received therein engages the conductive element engaging portion of a contact received in the contact receiving aperture.

In the present invention, the contacts comprise very thin, substantially flat plates having a thickness of, for example, ten thousandths of an inch.

Accordingly, a plurality of contacts can be positioned very closely together in the housing so as to readily accommodate components having closely spaced leads thereon.

In accordance with a presently preferred embodiment of the invention, the housing has a plurality of elongated slots for receiving a plurality of contacts. Each elongated slot extends through the housing from an elongated opening in a top wall of the housing through which a contact is inserted into the housing, to an elongated opening in the bottom wall of the housing through which the tail portion of the contact extends. The elongated slots are sized and configured to receive and support the contacts securely within the housing so as to reliably retain the contact engaging portion and the tail portion of each contact in proper position within the housing.

The at least one conductive element receiving aperture also preferably comprises a plurality of conductive element receiving apertures each of which extends into the housing from a further opening in the bottom wall of the housing and which intersects with the first section of a slot to guide a conductive element into the housing and into engagement with a conductive element receiving portion of a contact. The conductive element receiving apertures are preferably of rectangular cross-section (e.g., square cross-section), and are, in part, defined by recessed portions on opposed interior walls of the elongated slots.

The connector of the present invention is mountable to a top surface of a printed circuit board and is electrically connectable, as by soldering, to circuit traces on the bottom surface of the board by extending the tail portions of contacts of the connector through holes in the board. An electrical component on the bottom surface of the board is connectable to the connector after all soldering has been completed by extending leads thereof through the same or different holes in the board into the conductive element receiving apertures of the connector.

Further advantages and specific details of the invention will become apparent hereinafter in conjunction with the following detailed description of a presently preferred embodiment.

DETAILED DESCRIPTION OF THE PREFERRED EMBODIMENT

Figure 1:
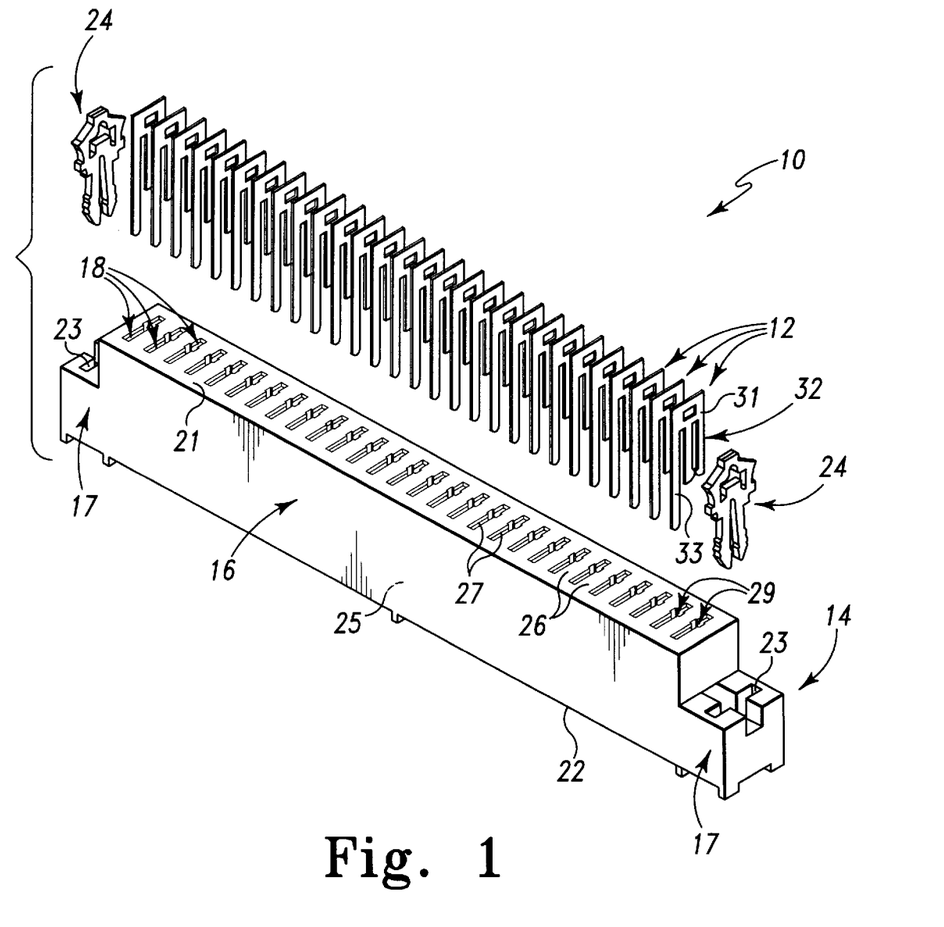
FIG. 1 is an exploded perspective view illustrating an electrical connector for printed circuit boards according to a presently preferred embodiment of the invention.

FIG. 1 is an exploded perspective view illustrating an electrical connector according to a presently preferred embodiment of the invention. The connector is designated by reference number 10, and generally comprises a plurality of contacts 12 and a housing 14 for supporting the contacts.

Housing 14 includes an elongated body portion 16 and a pair of mounting portions 17 which are of reduced height and which extend outwardly from the ends of the body portion. Housing 14 is typically molded of an appropriate engineering plastic having suitable dielectric characteristics as is well known to those skilled in the art.

Body portion 16 of housing 14 has a plurality of contact receiving apertures 18 therein which are configured to receive and support the plurality of contacts 12; and a plurality of conductive element receiving apertures 29 which are positioned to receive conductive elements, such as leads, of an electrical component to be connected by the connector. Each mounting portion 17 of housing 14 also has an aperture 23 for receiving and supporting a boardlock member 24. Boardlock members 24 are used to attach the connector 10 to a printed circuit board while the connector is being electrically connected to circuits on the board as will be explained in detail hereinafter.

Contacts 12 are identical, and each comprises a substantially flat plate having a body portion 31, a conductive element engaging portion 32 and a tail portion 33. Conductive element engaging portion 32 engages a conductive element positioned in a conductive element receiving aperture of the housing, and tail portion 33 is electrically connectable to a circuit on a printed circuit board in order to electrically connect the component to the printed circuit board. The specific construction of the contacts and the housing will also be described in detail hereinafter.

Figure 2:
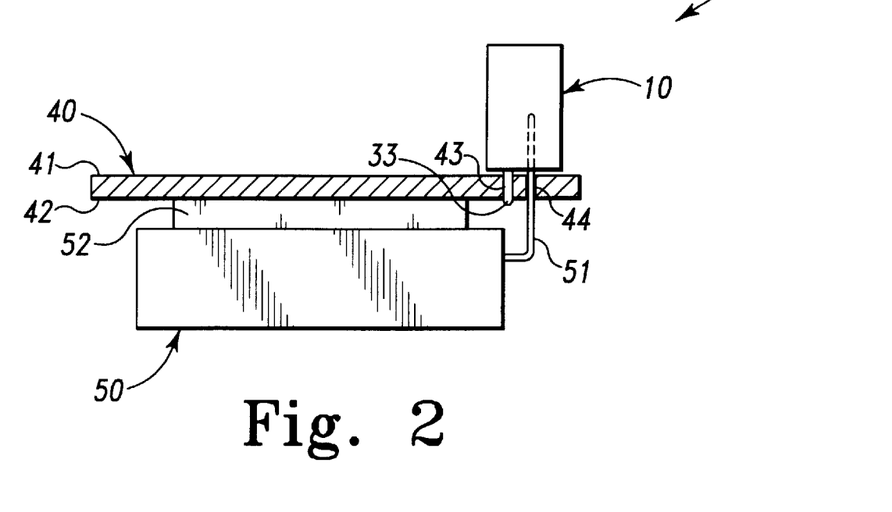
FIG. 2 schematically illustrates a side view of an assembly incorporating the electrical connector of FIG. 1.

FIG. 2 illustrates the environment in which the electrical connector of the present invention is typically utilized; and, in particular, schematically illustrates a side view of an assembly 35, which includes the connector 10, a printed circuit board 40 and an electrical component 50.

Printed circuit board 40 includes a top surface 41 and a bottom surface 42. Electrical circuits (not shown) are provided on the board in any conventional manner and include circuit traces on the bottom surface 42 to which the tail portions 33 of the contacts 12 of connector 10 are to be electrically connected, as by soldering, to electrically connect the connector 10 to the printed circuit board. As shown in FIG. 2, connector 10 is mounted on the top surface 41 of the printed circuit board, and electrical component 50 is positioned on the bottom surface 42 (solder side) of the board.

In the embodiment described herein, electrical component 50 comprises a vacuum fluorescent display. This is intended to be exemplary only as it is not intended to limit the invention to any particular kind of component. A plurality of leads 51 (also see FIG. 9) extend from the display upwardly through holes in the board and through the bottom of the connector housing into the connector 10 to be engaged by the conductive element engaging portions 32 of the contacts 12. As is known to those skilled in the art, connector 10 comprises a bottom entry type electrical connector.

Figure 3:
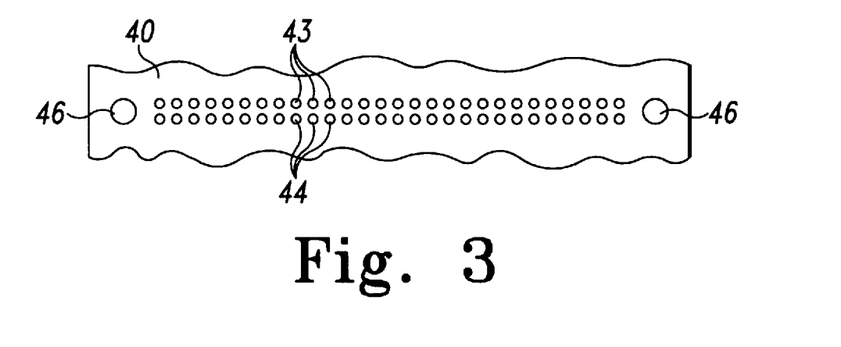
FIG. 3 illustrates a portion of a surface of the printed circuit board in the assembly of FIG. 2.

More particularly, as shown in FIG. 3, printed circuit board 40 includes a first plurality of holes 43 and a second plurality of holes 44. Holes 43 comprise solder tail holes through which the tail portions 33 of contacts 12 extend, and holes 44 comprise display lead holes through which the leads 51 of the vacuum fluorescent display extend.

As shown in FIG. 3, the printed circuit board 40 also includes a pair of holes 46 which are positioned to receive the ends of the boardlocks 24 to attach the connector 10 to the board for soldering.

Figure 4:
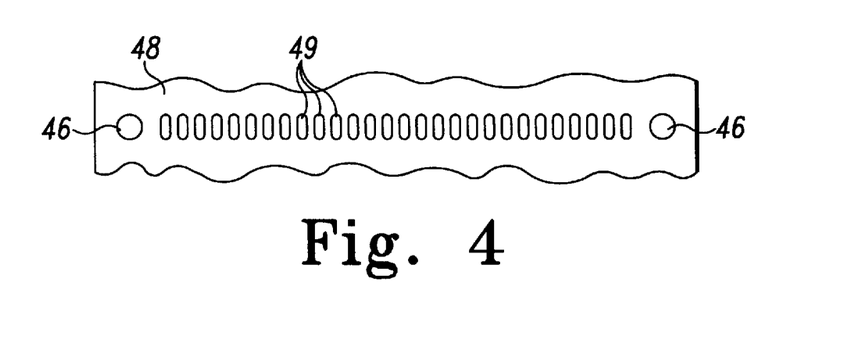
FIG. 4 illustrates a portion of a surface of a printed circuit board according to an alternative embodiment of the invention.

FIG. 4 illustrates an alternative design in which a printed circuit board 48 is provided with a single set of elongated holes 49 through which both the tail portions of the connector and the leads of the display are extended. Either the design of FIG. 3 or the design of FIG. 4 or yet a different design may be used with the present invention, and it is not intended to limit the invention to any particular hole arrangement on the printed circuit board.

Referring back to FIG. 2, to complete assembly 35, connector 10 is positioned on the top surface 41 of the printed circuit board 40 with the apertures 23 thereof 35 and the boardlocks 24 therein aligned with holes 46 on circuit board 40. The conductive element engaging portions 32 of the contacts 12 will also be aligned with holes 44 on the printed circuit board, and the tail portions 33 of the contacts will be aligned with and extend through the holes 43 in the board. The boardlocks 24 are extended into and through holes 46 on the board to attach the connector 10 to the board in the proper position. The ends of the tail portions are then soldered to circuit traces on the bottom surface 42 of the printed circuit board to electrically connect the connector to the board. The boardlocks 24 can also be soldered to the board, if desired, to further secure the connector to the board. Soldering can conveniently be accomplished by wave soldering techniques as is known to those skilled in the art.

After the connector 10 has been soldered to the printed circuit board 40, the leads 51 of the vacuum fluorescent display are inserted through the holes 44 in the printed circuit board and into the connector 10 to engage conductive element engaging portions 32 of the contacts 12 of the connector thus electrically connecting the display to the printed circuit board through the connector 10. The display 50 may also be secured to the bottom surface 42 of the board by a suitable tape 52 as shown in FIG. 2.

As is apparent, the display 50 is connected to the assembly 35 after all soldering has been completed; and, therefore, will not be damaged by the soldering process.

Figure 5:
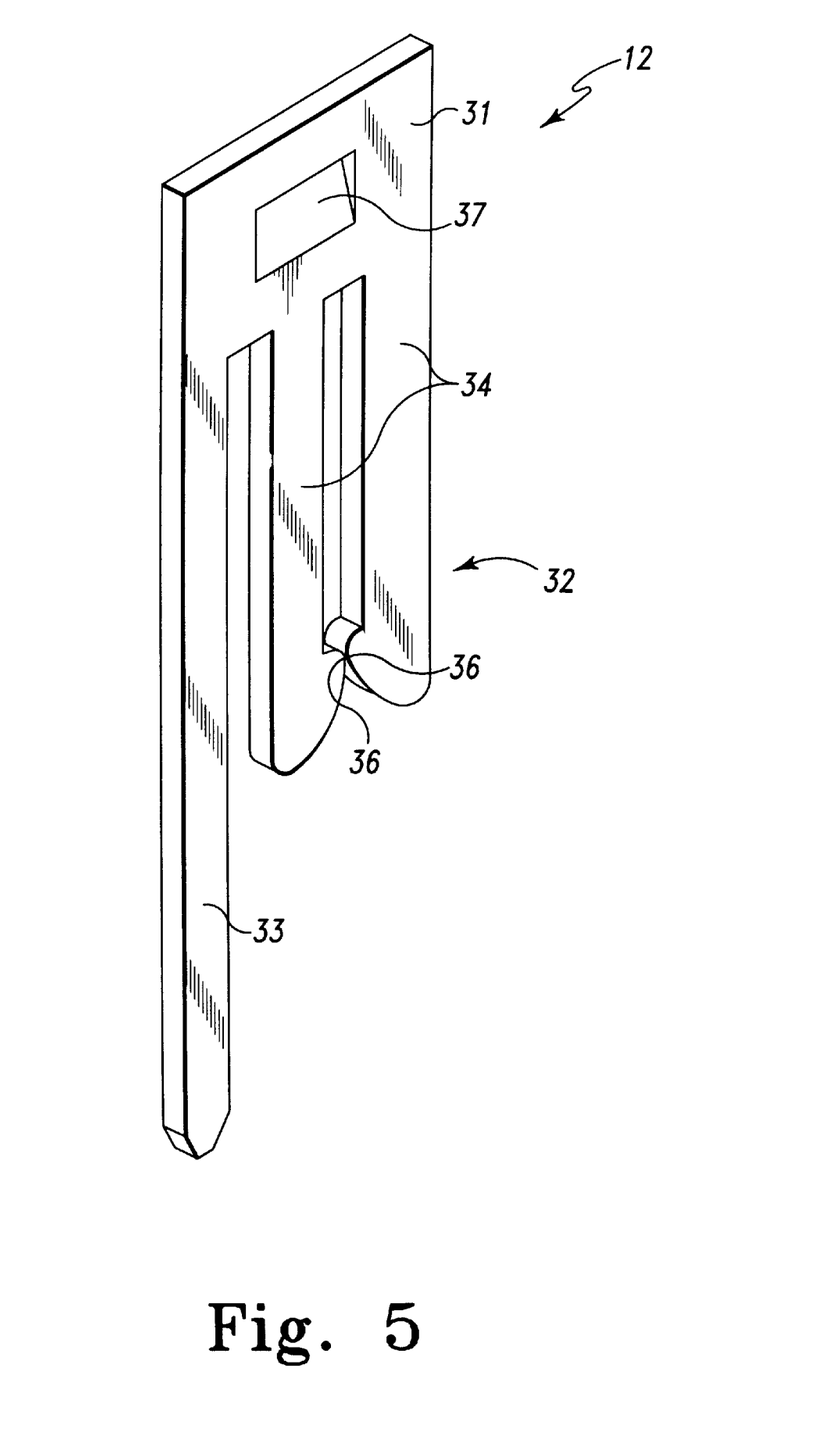
FIG. 5 is an enlarged perspective view illustrating a contact of the connector of FIG. 1.

FIG. 5 illustrates a contact 12 of connector 10 in greater detail. As indicated previously, the contact comprises a substantially flat plate formed of phosphor bronze or another suitable electrically conductive material, usually having appropriate coatings applied thereto as is known in the art. The contact is formed to have an upper contact body portion 31 of generally rectangular shape, and a conductive element engaging portion 32 and a tail portion 33 which are integral with and extend downwardly from the body portion 31.

The conductive element engaging portion 32 comprises a generally U-shaped portion having downwardly extending arms 34 which include inwardly facing rounded surfaces 36 adjacent the bottom ends thereof which are adapted to engage a lead 51 of display 50 extended therebetween.

Tail portion 33 comprises a straight, pin-like member which extends downwardly from the body portion 31 adjacent to and substantially parallel with the conductive element engaging portion 32. The tail portion is somewhat longer than the conductive element engaging portion so as to be of sufficient length to extend through the holes 43 in the printed circuit board 40 as described above.

A projection or lance 37 is formed in the body portion 31 of contact 12 and extends sideways from the body portion to secure the contact within an aperture 18 of the housing 14 by engaging an internal surface of the housing.

As should be apparent from FIG. 5, with the exception of projection 37, the contact 12 comprises a flat, very thin plate. The body portion 31, the conductive element engaging portion 32 and the tail portion 33 are all oriented in the same plane (i.e., are coplanar). As a result, and as will be explained more fully hereinafter, the plurality of contacts 12 of the connector 10 can be spaced very closely together such that the connector 10 may accommodate a component, i.e., a vacuum fluorescent display, having very closely spaced leads.

Figure 6:
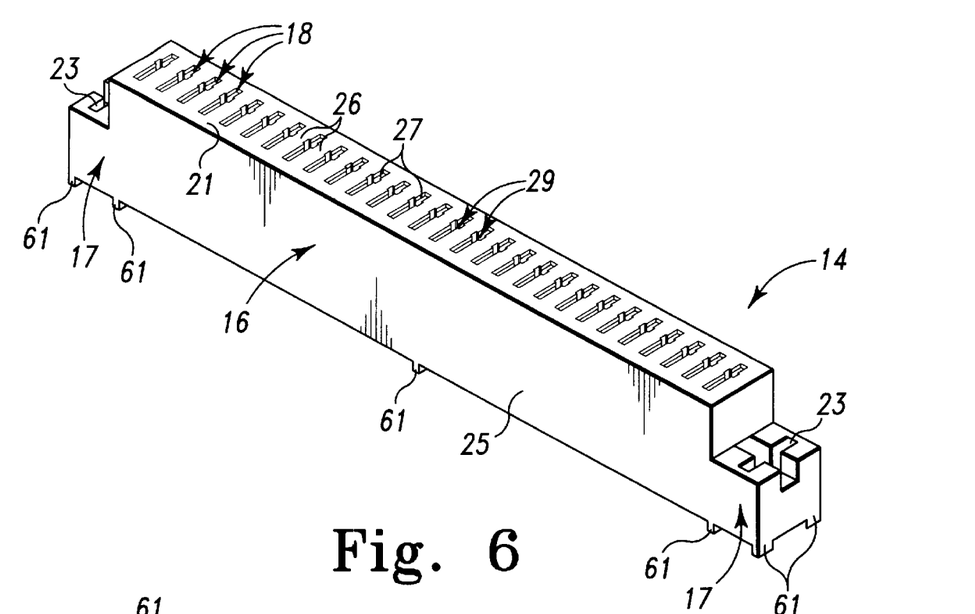
FIG. 6 is a top perspective view of the housing of the connector of FIG. 1.
Figure 7:
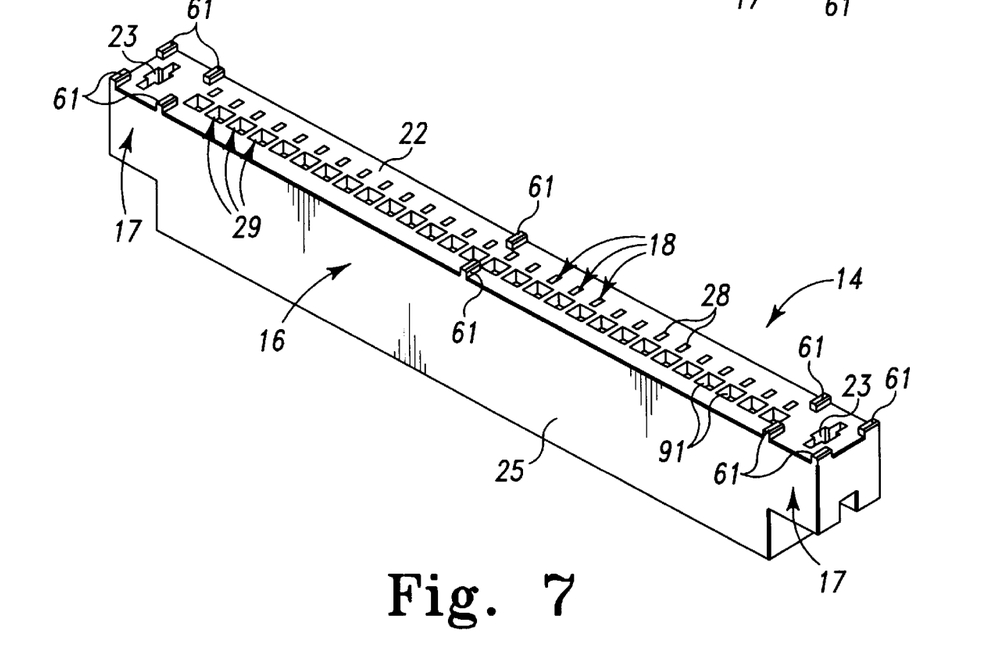
FIG. 7 is a bottom perspective view of the housing of FIG. 6.

FIG. 6 and 7 illustrate housing 14 of connector 10 in greater detail. FIG. 6 is a top perspective view, similar to that shown in FIG. 1, and FIG. 7 is a bottom perspective view of the housing.

As indicated previously, a body portion 16 of housing 14 includes a plurality of contact receiving apertures 18 and a plurality of conductive element receiving apertures 29. The apertures 18 and 29 are uniformly spaced along the length of the body portion 16, and are separated from one another by vertical separating walls 26.

As shown in FIG. 6 and 7 contact receiving apertures 18 comprise narrow, elongated slots which are parallel to one another and which extend between and are spaced from the opposed side walls 25 of the housing. Each slot 12 extends through the housing 14 from an elongated opening 27 in the top wall 21 to an elongated opening 28 in the bottom wall 22. Openings 27 are of a length to permit insertion of the contacts 12 therethrough into the housing as shown in FIG. 1. Openings 28 in the bottom wall 22 of the housing are shorter than openings 27 and are sized to have tail portions 33 of contacts 12 extended therethrough.

Conductive element receiving apertures 29 extend into the housing from an opening 91 in the bottom wall 22 of the housing. Apertures 29 are of rectangular cross-section, for example, square cross-section; and, as will be explained hereinafter intersect with the contact receiving apertures such that conductive elements inserted therein will be engaged by the conductive element engaging portions of the contacts therein.

As also best shown in FIG. 7, the bottom wall 22 of housing 14 is provided with a plurality of support legs or stand-offs 61 to support the connector 10 on and slightly spaced from the top surface 41 of the printed circuit board 40 to facilitate cleaning of the board.

Figure 8:
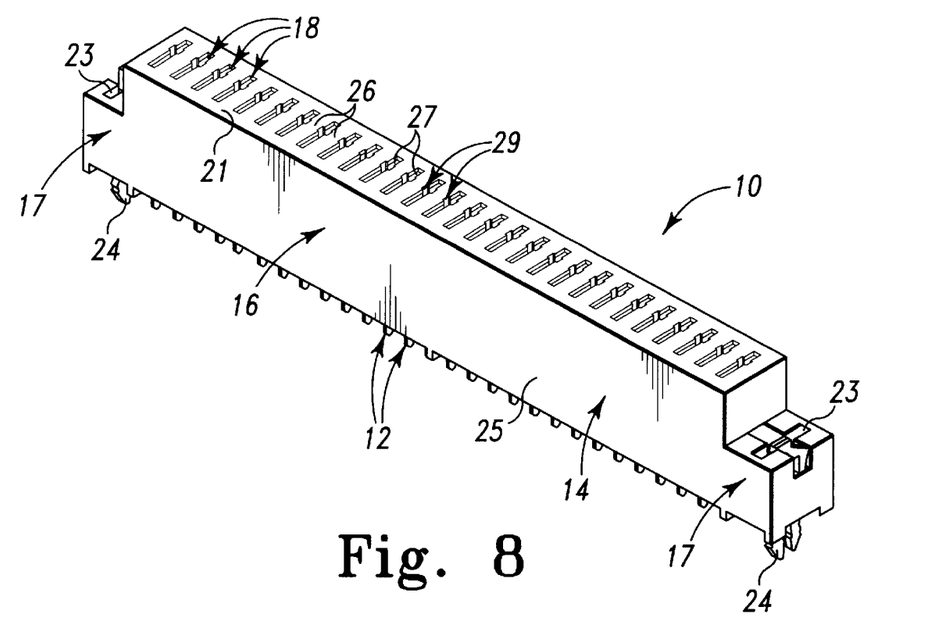
FIG. 8 is a top perspective view of the connector of FIG. 1.
Figure 9:
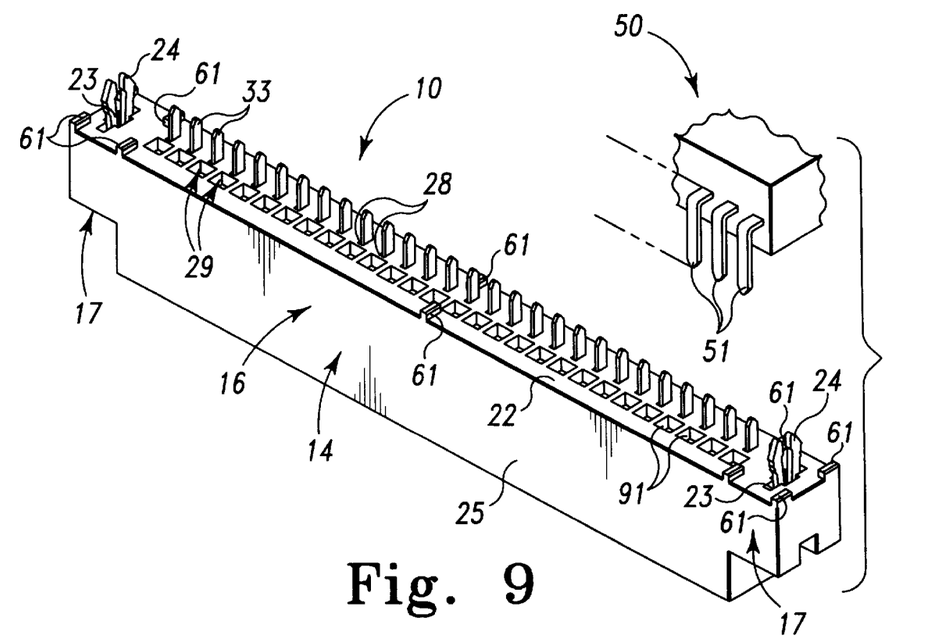
FIG. 9 is a bottom perspective view of the connector of FIG. 8 also illustrating a portion of the component of the assembly of FIG. 2.

FIGS. 8 and 9 are top and bottom perspective views, respectively, similar to FIGS. 6 and 7, but show the housing member 14 with the contacts 12 and the boardlocks 24 mounted therein to provide the connector 10. FIG. 9 also schematically illustrates a portion of the vacuum fluorescent display 50. As shown, when the contacts 12 are mounted in the housing 14, they extend fully within the housing with only the ends of the tail portions 33 thereof extending out of the housing through elongated openings 28. Similarly, the boardlocks extend through the apertures 23. In this condition, the connector 10 can be mounted on and soldered to printed circuit board 40 or 48.

Figure 10:
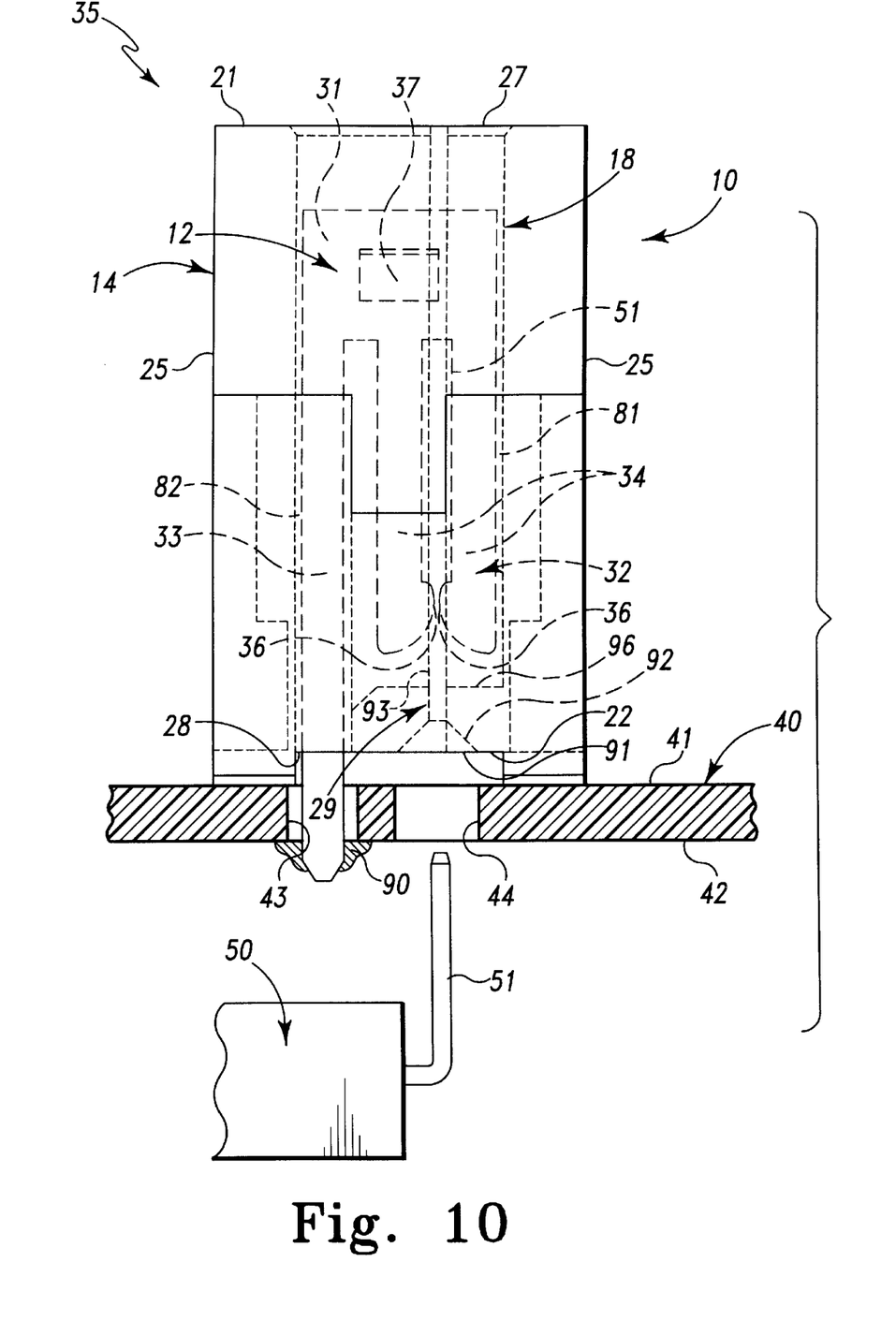
FIG. 10 is a side view of the assembly of FIG. 2 with the component thereof separated from the connector and illustrating the internal configuration of the apertures in the connector housing.

FIG. 10 is a side view of assembly 35 comprised of the connector 10, the printed circuit board 40 and the vacuum fluorescent display 50 ((the display is not attached to the connector in this FIG.). In FIG. 10, the boardlock 24 is not shown for purposes of clarity, and the internal configuration of the apertures 18 and 29 are shown in dotted line.

As shown, each contact receiving aperture 18 comprises a narrow elongated slot which extends through the housing from elongated opening 27 in the top wall 21 of the housing to elongated opening 28 in the bottom wall 22 of the housing. Each elongated slot is configured to define within the housing a first section 81 for receiving the conductive element engaging portion of a contact 12, and a second section 82 for receiving the tail portion of the contact. The second section 82 extends to the elongated opening 28 in bottom wall 22 of the housing; however, the first section 81 terminates at an internal wall 96 and does not extend to the bottom wall 22.

When a contact 12 is inserted in a slot 18 through elongated opening 27 in top wall 21, the conductive element engaging portion 32 is received in first section 81 of the slot, and the tail portion 33 is received in second section 82 of the slot and extends through elongated opening 28 in the bottom wall 22 as shown.

Each conductive element receiving aperture 29 comprises a rectangular-shaped (e.g., square-shaped) aperture which extends into the housing 14 from an opening 91 in the bottom wall 22. Apertures 29 are of truncated shape adjacent opening 91 as shown at 92 such that the apertures narrow down to passageway portions 93 which extends upwardly through the housing to top wall 21.

Figure 11:
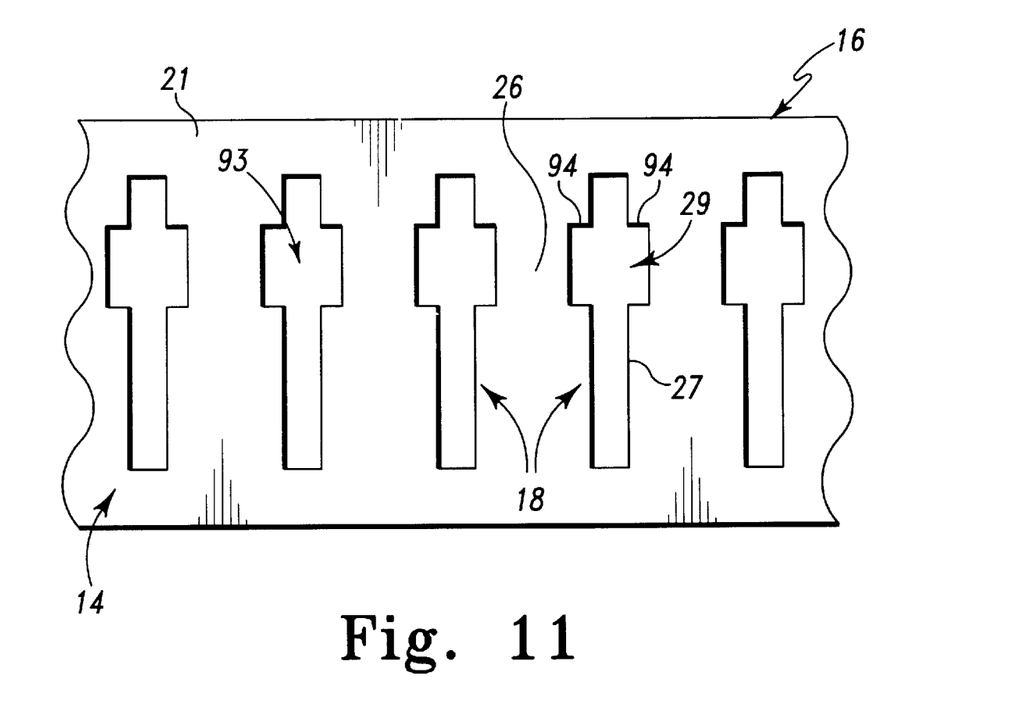
FIG. 11 is an enlarged, schematic view of a portion of the upper surface of the housing of the connector of FIG. 1 to illustrate a detail thereof.

Passageway portion 93 of apertures 29 are positioned to intersect the elongated slots in the vicinity of the first section of the elongated slots. In particular, as shown in FIG. 11, the opposed sidewalls of slots 18 are provided with opposed rectangular-shaped recesses 94 which together define the substantially square passageway portions 93 of the apertures 29.

Conductive element receiving apertures 29 are positioned to receive the leads 51 of component 50 through openings 91, and to guide the leads between the curved surfaces 36 of the conductive element engaging portions 32 of the contacts 12. As the leads are inserted between the surfaces 36, the arms 34 of the contacts are pushed apart somewhat so as to firmly engage the leads with a spring force to ensure reliable mechanical and electrical contact therebetween.

As described above, each contact receiving aperture 18 is in the form of a narrow slot which supports the flat contact firmly in position in the housing while permitting only slight movement of the contact. Lead 51 is somewhat wider than the thickness of the contact (the width of a contact is, for example, about ten thousandths of an inch); and, the passageway portion 93 of conductive element receiving aperture 29 is sized to receive the lead and to guide and position the lead between the arms 34 of the contact engaging portion 32 of the contact to be firmly engaged by contact.

In general, with the present invention, it is possible to provide a bottom entry type electrical connector having a large number of very closely spaced contacts to accommodate components having closely-spaced leads. Connector 10, for example, can readily be made to accommodate components having leads on, for example, 1.5 mm, 2 mm and 0.100 inch centerlines.

In addition, the connector 10 can be designed to connect a component having any number of leads. In the illustrated embodiment, a 28 position connector is shown to receive leads from a 28 position display. Displays having other numbers of leads, for example, a 76 position display could also be accommodated by a bottom entry connector of the present invention.

While what has been described constitutes a presently preferred embodiment of the invention, it should be recognized that the invention could take numerous other forms. It should be understood, therefore, that the invention is to be limited only insofar as is required by the scope of the following claims.

What is claimed is:

1. An electrical connector mountable to a surface of a printed circuit board for electrically connecting a component to said board, said electrical connector comprising:
   at least one contact, each of said at least one contacts comprising a substantially flat plate which includes:
      a conductive element engaging portion engagable with a conductive element of said component; and
      a tail portion connectable to said printed circuit board; and
   a housing for supporting each of said at least one contacts, said housing including:
      at least one contact receiving aperture which receives said at least one contact, each of said at least one contact receiving apertures comprising an elongated slot having a first section which receives the conductive element engaging portion of a contact, and a second section which receives the tail portion of the contact, said second section including an elongated opening in a bottom wall of said housing through which said tail portion of the contact extends to be connected to said printed circuit board; and
      at least one conductive element receiving aperture, each of said at least one conductive element receiving apertures intersecting with the first section of a contact receiving aperture such that a conductive element of said component received therein engages with the conductive element engaging portion of a contact received in said contact receiving aperture.

2. The electrical connector of claim 1 wherein each of said at least one contact receiving apertures extends through said housing from an elongated opening in a top wall of said housing to said elongated opening in said bottom wall of said housing.

3. The electrical connector of claim 2 wherein said elongated opening in said top wall of said housing is of a length sufficient for insertion of a contact therethrough into said contact receiving aperture, and wherein said elongated opening in said bottom wall is of a length less than that of said elongated opening in said top wall for extending said tail portion of said contact therethrough.

4. The electrical connector of claim 2 wherein said elongated opening in said bottom wall of said housing comprises a first opening in said bottom wall of said housing, and wherein each of said at least one conductive element receiving apertures extends into said housing from a second opening in said bottom wall of said housing.

5. The electrical connector of claim 4 wherein each of said at least one conductive element receiving apertures are of rectangular cross-section.

6. The electrical connector of claim 5 wherein each of said at least one contact receiving apertures includes recessed portions on opposed interior walls thereof to define a portion of a conductive element receiving aperture which intersects with said second section of said contact receiving aperture.

7. The electrical connector of claim 2 wherein each of said at least one contacts further includes a body portion, and wherein said conductive element engaging portion and said tail portion extend downwardly from said body portion substantially parallel to one another.

8. The electrical connector of claim 7 wherein said conductive element engaging portion includes a pair of downwardly extending arms for engaging a conductive element of said component therebetween.

9. The electrical connector of claim 1 and further including at least one locking member for attaching said connector to said printed circuit board prior to connection of said tail portion of each of said at least one contacts to said board.

10. The electrical connector of claim 1 wherein said at least one contact comprises a plurality of contacts, wherein said at least one contact receiving aperture comprises a plurality of contact receiving apertures, and wherein said at least one conductive element receiving aperture comprises a plurality of conductive element receiving apertures.

11. An electrical connector mountable to a surface of a printed circuit board for electrically connecting a component to said board, said electrical connector comprising:
   a plurality of contacts, each of said plurality of contacts comprising a substantially flat plate which includes;
      a conductive element engaging portion engagable with a conductive element of said component; and
      a tail portion connectable to said printed circuit board; and
   a housing for supporting said plurality of contacts, said housing including:
      a plurality of contact receiving apertures which receive said plurality of contacts, each of said plurality of contact receiving apertures comprising an elongated slot extending from an elongated opening in a top wall of said housing to an elongated opening in a bottom wall of said housing, and having a first section which receives the conductive element engaging portion of a contact and a second section which receives the tail portion of the contact, the tail portion of the contact extending through the elongated opening in the bottom wall of the housing; and
      a plurality of conductive element receiving apertures, each of said plurality of conductive element receiving apertures intersecting with the first section of a contact receiving aperture such that a conductive element of said component received therein engages with the conductive element engaging portion of a contact received in said contact receiving aperture.

12. The electrical connector of claim 11 wherein said elongated opening in said top wall of said housing is of a length sufficient for insertion of a contact therethrough into said contact receiving aperture, and wherein said elongated opening in said bottom wall is of a length less than that of said elongated opening in said top wall for extending said tail portion of said contact therethrough.

13. The electrical connector of claim 12 wherein said elongated opening in said bottom wall of said housing comprises a first opening in said bottom wall of said housing, and wherein each of said conductive element receiving apertures extends into said housing from a second opening in said bottom wall of said housing.

14. The electrical connector of claim 13 wherein each of said plurality of conductive element receiving apertures is of rectangular cross-section.

15. The electrical connector of claim 14 wherein each of said contact receiving apertures includes recessed portions on opposed interior walls thereof to define a portion of a conductive element receiving aperture which intersects with said second section of said contact receiving aperture.

16. The electrical connector of claim 11 wherein each of said contacts further includes a body portion, and wherein said conductive element engaging portion and said tail portion extend downwardly from said body portion substantially parallel to one another.

17. The electrical connector of claim 16 wherein said conductive element engaging portion includes a pair of downwardly extending arms for engaging a conductive element of said component therebetween.

18. The electrical connector of claim 11 wherein said plurality of contact receiving apertures are substantially parallel to one another.

19. An assembly comprising a printed circuit board, a component having a plurality of leads positioned on a bottom surface of said board and an electrical connector mounted on a top surface of said board and electrically connecting said component to said board, said electrical connector comprising:

a plurality of contacts, each of said plurality of contacts comprising a substantially flat plate which includes:
  a conductive element engaging portion engaging a lead of said component; and
  a tail portion connected to said printed circuit board; and a housing for supporting said plurality of contacts, said housing including:
  a plurality of contact receiving apertures which receive said plurality of contacts, each of said plurality of contact receiving apertures comprising an elongated slot extending from an elongated opening in a top wall of said housing to an elongated opening in a bottom wall of said housing, and having a first section which receives the conductive element engaging portion of a contact and a second section which receives the tail portion of the contact, the tail portion of the contact extending through the elongated opening in the bottom wall of the housing and through a hole in the printed circuit board; and
  a plurality of conductive element receiving apertures, each of said plurality of conductive element receiving apertures intersecting with the first section of a contact receiving aperture such that a lead of said component extending through a hole in the printed circuit board and received in a conductive element receiving aperture engages with the conductive element engaging portion of a contact received in said contact receiving aperture.

* * * * *